US 9,941,456 B2

(12) United States Patent
Ko et al.

(10) Patent No.: US 9,941,456 B2
(45) Date of Patent: Apr. 10, 2018

(54) THERMOELECTRIC MATERIALS AND THEIR MANUFACTURING METHOD

(71) Applicant: LG CHEM, LTD., Seoul (KR)

(72) Inventors: Kyung-Moon Ko, Daejeon (KR); Tae-Hoon Kim, Daejeon (KR); Cheol-Hee Park, Daejeon (KR)

(73) Assignee: LG CHEM, LTD., Seoul (KR)

( * ) Notice: Subject to any disclaimer, the term of this patent is extended or adjusted under 35 U.S.C. 154(b) by 173 days.

(21) Appl. No.: 14/915,181

(22) PCT Filed: Oct. 17, 2014

(86) PCT No.: PCT/KR2014/009796
§ 371 (c)(1),
(2) Date: Feb. 26, 2016

(87) PCT Pub. No.: WO2015/057019
PCT Pub. Date: Apr. 23, 2015

(65) Prior Publication Data
US 2016/0218267 A1 Jul. 28, 2016

(30) Foreign Application Priority Data

Oct. 17, 2013 (KR) .................. 10-2013-0124050
Jun. 9, 2014 (KR) .................. 10-2014-0069532
Sep. 30, 2014 (KR) .................. 10-2014-0131799

(51) Int. Cl.
*H01L 35/14* (2006.01)
*H01L 35/34* (2006.01)
(Continued)

(52) U.S. Cl.
CPC .............. *H01L 35/16* (2013.01); *B22F 3/105* (2013.01); *C01B 19/002* (2013.01); *C01B 19/007* (2013.01); *C22C 9/00* (2013.01); *B22F 2003/1051* (2013.01); *C01P 2002/72* (2013.01); *C01P 2002/85* (2013.01); *C01P 2004/01* (2013.01); *C01P 2004/80* (2013.01); *C01P 2006/40* (2013.01)

(58) Field of Classification Search
CPC .. H01L 35/16; B22F 3/105; B22F 3/10; B22F 2003/1051; C01P 2002/90
See application file for complete search history.

(56) References Cited

U.S. PATENT DOCUMENTS 3,873,370 A 3/1975 Hampl, Jr. et al.
2011/0139208 A1 6/2011 Lee et al.

FOREIGN PATENT DOCUMENTS

CA 948789 A 4/1974
DE 20 08 378 A1 9/1971
(Continued)

OTHER PUBLICATIONS

Sedat Ballikaya et al., "Thermoelectric properties of Ag-doped Cu$_2$Se and Cu$_2$Te", Journal of Materials Chemistry A, Aug. 16, 2013, pp. 12478-12484, vol. 1, The Royal Society of Chemistry.
(Continued)

*Primary Examiner* — C Melissa Koslow

(57) ABSTRACT

Disclosed is a thermoelectric material with excellent thermoelectric conversion performance. The thermoelectric material includes a matrix having Cu and Se, a Cu-containing particle, and an Ag-containing structure.

15 Claims, 9 Drawing Sheets

(51) Int. Cl.
   *H01L 35/16*    (2006.01)
   *C01B 19/00*    (2006.01)
   *B22F 3/105*    (2006.01)
   *C22C 9/00*     (2006.01)

(56) References Cited

FOREIGN PATENT DOCUMENTS

| | | |
|---|---|---|
| DE | 21 23 069 A1 | 11/1971 |
| JP | S49-006015 | 2/1974 |
| KR | 10-2011-0052225 A | 5/2011 |
| KR | 10-2012-0057442 A | 6/2012 |
| KR | 10-2012-0085639 A | 8/2012 |
| KR | 10-2013-0071531 A | 7/2013 |

OTHER PUBLICATIONS

International Search Report for International Patent Application No. PCT/KR2014/009796 filed Oct. 17, 2014.

Kantapat Chansaenpak et al., "The solution route synthesis of the $Cu_{0.5}Ag_{1.5}InSe_3$ compound for thermoelectric applications", Journal of Ceramic Processing Research, 2010, pp. 742-746, vol. 11, No. 6.

M. KH. Balapanov et al., "Ion Transfer in Solid Solutions of $Cu_2Se$ and $Ag_2Se$ Superionic Conductors", Physics of the Solid State, Apr. 1, 2003, pp. 634-638, vol. 45, No. 4, Nauka/Interperiodica.

THERMOELECTRIC MATERIALS AND THEIR MANUFACTURING METHOD

TECHNICAL FIELD

The present disclosure relates to thermoelectric conversion technology, and more particularly, to a thermoelectric conversion material with excellent thermoelectric conversion properties, its manufacturing method and its use.

The present application is a National Stage of International Patent Application No. PCT/KR2014/009796, filed on Oct. 17, 2014, which claims priority to Korean Patent Application No. 10-2013-0124050 filed on Oct. 17, 2013, Korean Patent Application No. 10-2014-0069532 filed on Jun. 9, 2014 and Korean Patent Application No. 10-2014-0131799 filed on Sep. 30, 2014 in the Republic of Korea, the disclosures of which are incorporated herein by reference.

BACKGROUND ART

A compound semiconductor is a compound that is composed of at least two types of elements rather than one type of element such as silicon or germanium and operates as a semiconductor. Various types of compound semiconductors have been developed and are currently being used in various fields of industry. Typically, a compound semiconductor may be used in thermoelectric conversion elements using the Peltier Effect, light emitting devices using the photoelectric conversion effect, for example, light emitting diodes or laser diodes, fuel cells, and the like.

Particularly, a thermoelectric conversion element is used for thermoelectric conversion power generation or thermoelectric conversion cooling applications, and generally includes an N-type thermoelectric semiconductor and a P-type thermoelectric semiconductor electrically connected in series and thermally connected in parallel. The thermoelectric conversion power generation is a method which generates power by converting thermal energy to electrical energy using a thermoelectromotive force generated by creating a temperature difference in a thermoelectric conversion element. Also, the thermoelectric conversion cooling is a method which produces cooling by converting electrical energy to thermal energy using an effect that a temperature difference creates between both ends of a thermoelectric conversion element when a direct current flows through the both ends of the thermoelectric conversion element.

The energy conversion efficiency of the thermoelectric conversion element generally depends on a performance index value or ZT of a thermoelectric conversion material. Here, the ZT may be determined based on the Seebeck coefficient, electrical conductivity, and thermal conductivity, and as a ZT value increases, a thermoelectric conversion material has better performance.

Heretofore, many kinds of thermoelectric conversion materials have been proposed, but there is substantially no thermoelectric conversion material with sufficiently high thermoelectric conversion performance. In particular, thermoelectric conversion materials are applied to more and more fields, and temperature conditions may vary depending on their applied fields. However, since thermoelectric conversion materials may have different thermoelectric conversion performance depending on temperature, each thermoelectric conversion material needs to have optimized thermoelectric conversion performance suitable for its applied field. However, there is not yet proposed a thermoelectric conversion material with optimized performance for various and broad temperature ranges.

DISCLOSURE

Technical Problem

Accordingly, the present disclosure is designed to solve the above problem, and therefore, the present disclosure is directed to providing a thermoelectric material having excellent thermoelectric conversion performance over a broad temperature range, its manufacturing method and its use.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

After repeated studies on the thermoelectric material, the inventors of the present disclosure have successfully synthesized a new thermoelectric material and found that the thermoelectric conversion material can have excellent thermoelectric conversion performance.

The thermoelectric material according to the present disclosure includes a matrix having Cu and Se; a Cu-containing particle; and an Ag-containing structure.

Here, the Cu-containing particle may be a nanoparticle.

In addition, the Ag-containing structure may be a structure having a micrometer size.

In addition, the matrix may include a plurality of grains composed of Cu and Se and a plurality of grains composed of Cu, Ag and Se.

In addition, the Cu-containing particle may be located at a grain boundary of the matrix.

In addition, the thermoelectric material according to the present disclosure may be expressed by Chemical Formula 1 below.

$$Cu_2Ag_xSe \qquad \text{<Chemical Formula 1>}$$

In Chemical Formula 1, $0<x\leq0.6$.

In addition, in Chemical Formula 1, x may satisfy a condition of $0.025\leq x$.

In addition, in Chemical Formula 1, x may satisfy a condition of $x\leq0.2$.

In addition, in Chemical Formula 1, x may satisfy a condition of $x\leq0.1$.

In addition, in Chemical Formula 1, x may satisfy a condition of $x\leq0.075$.

In another aspect, the present disclosure also provides a method for manufacturing a thermoelectric material, which includes forming a mixture by weighing and mixing Cu, Ag and Se according to Chemical Formula 1; and thermally treating the mixture to synthesize a compound expressed by Chemical Formula 1.

Here, the method for manufacturing a thermoelectric material according to the present disclosure may further include sintering the compound under pressure after the compound forming step is performed.

In addition, the pressure sintering step may be performed by means of hot pressing or spark plasma sintering.

In addition, in the pressure sintering step, the compound may be ground into powder and sintered under pressure.

In addition, in the mixture forming step, Cu, Ag and Se in a powder form may be mixed.

Also, to achieve the above object, a thermoelectric conversion element according to the present disclosure includes the thermoelectric material according to the present disclosure.

Also, to achieve the above object, a thermoelectric power generator according to the present disclosure includes the thermoelectric material according to the present disclosure.

Advantageous Effects

According to the present disclosure, a thermoelectric material having excellent thermoelectric conversion performance may be provided.

Particularly, the thermoelectric material according to one aspect of the present disclosure may have low thermal diffusivity, high Seebeck coefficient and high ZT value in a broad temperature range of 200° C. to 600° C.

Accordingly, the thermoelectric material according to the present disclosure may replace a traditional thermoelectric material, or may be used as another material in conjunction with a traditional thermoelectric material.

Further, the thermoelectric material according to the present disclosure may maintain a high ZT value at temperature of 600° C., further at low temperature of about 200° C., in comparison to existing thermoelectric materials. Therefore, when used in a thermoelectric device for power generation, the thermoelectric material according to the present disclosure may ensure stable thermoelectric conversion performance even if the material is exposed to a comparatively low temperature.

Also, the thermoelectric material according to the present disclosure may be used in a solar cell, an infrared (IR) window, an IR sensor, a magnetic device, a memory, and the like.

DESCRIPTION OF DRAWINGS

The accompanying drawings illustrate a preferred embodiment of the present disclosure and together with the foregoing disclosure, serve to provide further understanding of the technical spirit of the present disclosure, and thus, the present disclosure is not construed as being limited to the drawing.

BEST MODE

Figure 1:
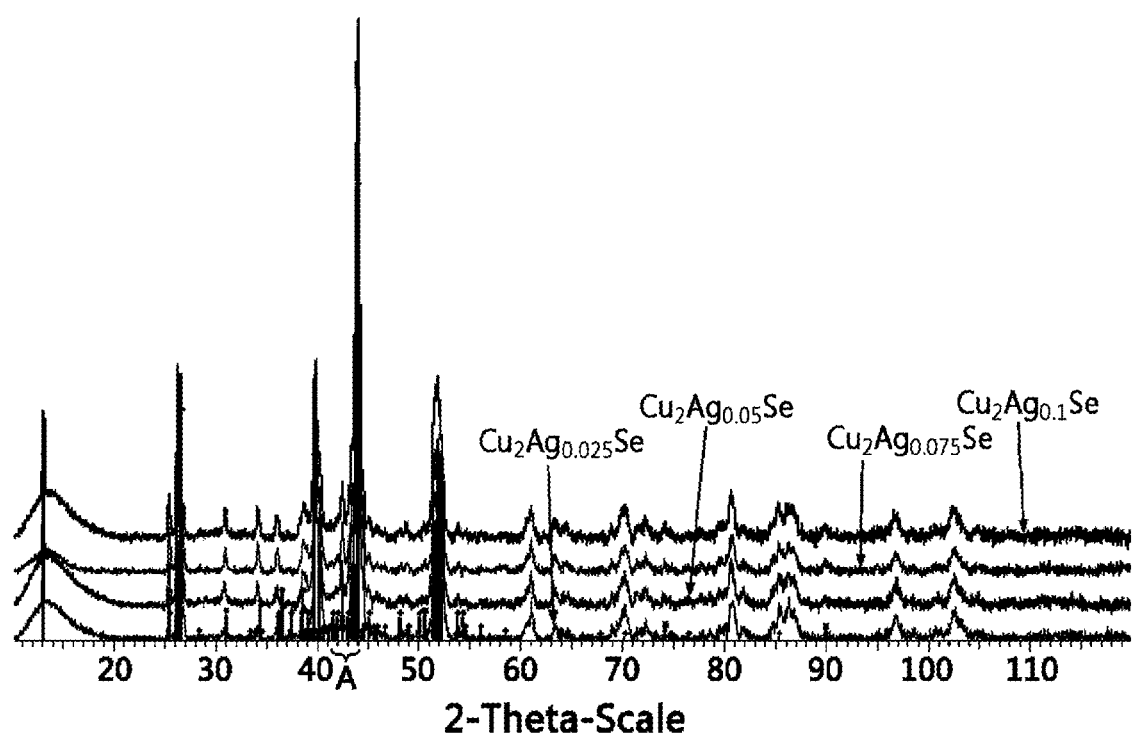
FIG. 1 is a graph showing XRD analysis results for thermoelectric materials according to several embodiments of the present disclosure.

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the spirit and scope of the disclosure.

A thermoelectric material according to the present disclosure may include a matrix having Cu and Se, a Cu-containing particle and an Ag-containing structure. In other words, the thermoelectric material of the present disclosure may further include a Cu-containing particle and an Ag-containing structure in addition to a matrix composed of a plurality of grains.

The matrix may include a Cu—Se matrix and a Cu—Ag—Se matrix. Here, the Cu—Se matrix may represent a plurality of grains composed of Cu and Se, and the Cu—Ag—Se matrix may represent a plurality of grains composed of Cu, Ag and Se.

The Cu-containing particle means a particle containing at least Cu, which may be understood as including a particle composed of only Cu and a particle containing at least one element other than Cu. For example, the Cu-containing particle of the present disclosure may include at least one of a Cu particle composed of only Cu and a Cu oxide such as $Cu_2O$.

In particular, in the thermoelectric material of the present disclosure, the Cu-containing particle may be present in a nanoparticle (nano-dot) form. In other words, the Cu-containing particle may have a particle diameter in a nanometer unit. For example, the Cu-containing particle may have a two-dimensional shape close to a circular or oval shape, and at this time a largest size may be 1 nanometer to 1000 nanometer. As described above, the thermoelectric material of the present disclosure may be regarded as a thermoelectric material including a Cu—Se matrix, a Cu—Ag—Se matrix and a Cu-containing nanoparticle.

The Ag-containing structure means a structure including at least Ag, which may be mainly composed of only Ag and may also contain other components.

Here, the Ag-containing structure may have a greater size than the Cu-containing particle. In particular, the Ag-containing structure may have a micrometer size, and in this aspect, the Ag-containing structure may be called a microstructure. For example, the Ag-containing structure may have a greatest length in the range of 1 micrometer to 1000 micrometer in a two-dimensional view.

The thermoelectric material of the present disclosure may include a second phase containing Ag in addition to the Cu—Se matrix or the Cu—Ag—Se matrix and the Cu-containing particle, and the second phase may form a structure of a micrometer size (for example, several micrometers to several ten micrometers). In particular, such microstructures containing Ag may have a line shape extending substantially in one direction, different from the Cu-containing particle having a circle-like or oval-like shape.

In addition, the microstructure may further include Cu and/or Se in addition to Ag. For example, the microstructure containing Ag may be a linear microstructure composed of Cu, Ag and Se.

Meanwhile, the Cu—Se-based thermoelectric material of the present disclosure including the Cu-containing particle and the Ag-containing structure may be expressed by Chemical Formula 1 below.

$$Cu_2Ag_xSe \qquad \text{<Chemical Formula 1>}$$

In Chemical Formula 1, $0<x\leq0.6$.

Preferably, in Chemical Formula 1, it is desirable to satisfy a condition of $0.025\leq x$. In particular, in Chemical Formula 1, it is desirable to satisfy a condition of $0.05\leq x$.

Also preferably, in Chemical Formula 1, it is desirable to satisfy a condition of $x\leq0.2$.

Further preferably, in Chemical Formula 1, it is desirable to satisfy a condition of $x\leq0.1$. In particular, in Chemical Formula 1, it is desirable to satisfy a condition of $x\leq0.075$. In the above condition, the thermoelectric material of the present disclosure may have further improved thermoelectric conversion performance.

In addition, in Chemical Formula 1, x may satisfy a condition of $0.025<x<0.075$. For example, in Chemical Formula 1, it is desirable to satisfy a condition of $x=0.05$. In this case, Chemical Formula 1 may be expressed as $Cu_2Ag_{0.05}Se$.

In this instance, a second phase may be partially included in the thermoelectric material represented by Chemical Formula 1, and its amount may change based on a thermal treatment condition.

The thermoelectric material of the present disclosure further includes Ag, compared with an existing compound semiconductor expressed as $Cu_2Se$. In addition, Ag may configure a Cu—Ag—Se matrix together with Cu and Se. Moreover, due to the addition of Ag, Cu not configuring a Cu—Se matrix or a Cu—Ag—Se matrix may appear, and this Cu may be present solely as a single element or bonded to another element. At this time, Cu not bonded to Ag and Se as described above may be included in the form of a nanoparticle. This will be described in more detail with reference to experiment results.

Figure 2:
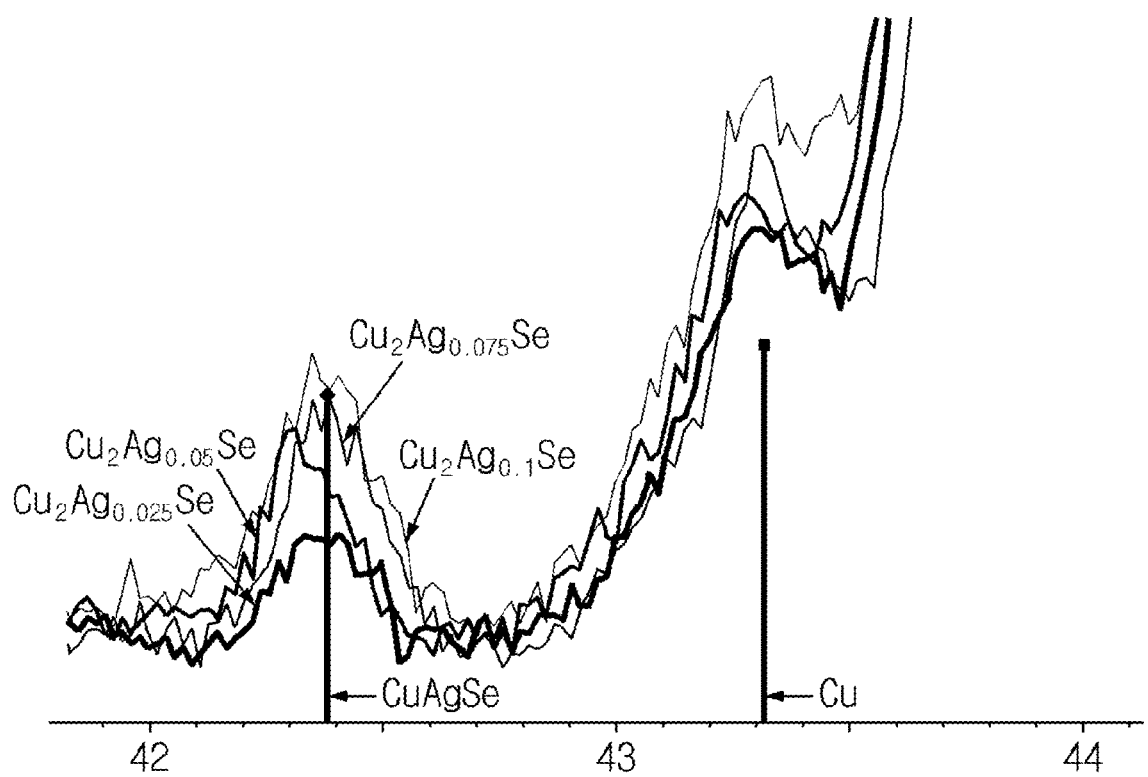
FIG. 2 is a graph showing a portion A of FIG. 1 in an enlarged state.

FIG. 1 is a graph showing XRD analysis results for thermoelectric materials according to several embodiments of the present disclosure, and FIG. 2 is a graph showing a portion A of FIG. 1 in an enlarged state.

In more detail, in FIGS. 1 and 2, as an embodiment of the present disclosure, analysis graphs (the unit of an x axis is counts, and the unit of a y axis is degree) on XRD patterns of thermoelectric materials expressed by $Cu_2Ag_xSe$ (x=0.025, 0.05, 0.075 or 0.1) (prepared according to Examples 1 to 4) are depicted. In particular, in FIG. 1, the XRD pattern analysis graphs of several examples are separately spaced apart from each other in a vertical direction for convenient classification. In addition, in FIG. 2, graphs of several examples are depicted to overlap each other for better comparison. Further, in FIG. 2, a CuAgSe peak representing a peak when Cu is provided to configure a matrix together with Ag and Se and a Cu peak representing a peak when Cu is provided as a single component are depicted.

Referring to FIGS. 1 and 2, it may be found that a CuAgSe peak and a Cu peak are formed in all examples, but an Ag peak is not formed. The thermoelectric material of the present disclosure, which may be expressed as $Cu_2Ag_xSe$ ($0<x\leq0.6$), further includes Ag in comparison to $Cu_2Se$ which is an existing thermoelectric material, and from the results of FIGS. 1 and 2, it may be understood that most of the added Ag are not present solely but configure Cu—Ag—Se matrixes. Along with it, due to the addition of Ag, it may be understood that a part of Cu does not configure a Cu—Se matrix or a Cu—Ag—Se matrix but is present solely.

In particular, from the result of FIG. 2, it may be understood that if x changes from 0.025 toward 0.1, namely if the amount of added Ag increases, the CuAgSe peak gets gradually higher and the Cu peak also gets gradually higher. This result may be regarded as showing that when Ag is added to Cu and Se, the added Ag configures a Cu—Ag—Se matrix and Cu is partially present solely in a particle form without forming a matrix together with Ag and Se. Here, the Cu-containing particle which is present solely due to the addition of Ag may have a nanoparticle form.

Meanwhile, in the thermoelectric material of the present disclosure, the Cu—Se matrix and/or the Cu—Ag—Se matrix may be composed of a plurality of grains. Here, the Cu-containing nanoparticle may be mainly formed at a plurality of grain boundaries of such a matrix.

Figure 3:
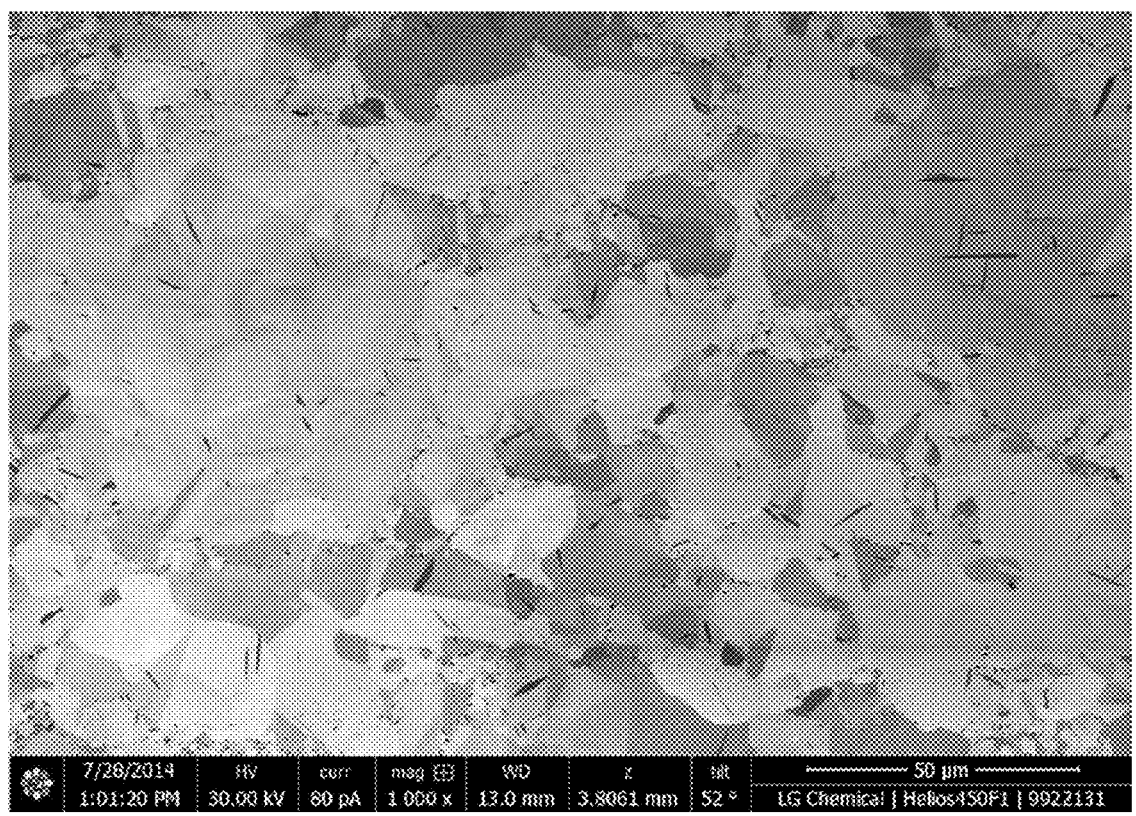
FIGS. 3 to 5 are scanning ion microscopy (SIM) photographs showing thermoelectric materials according to several embodiments of the present disclosure.
Figure 4:
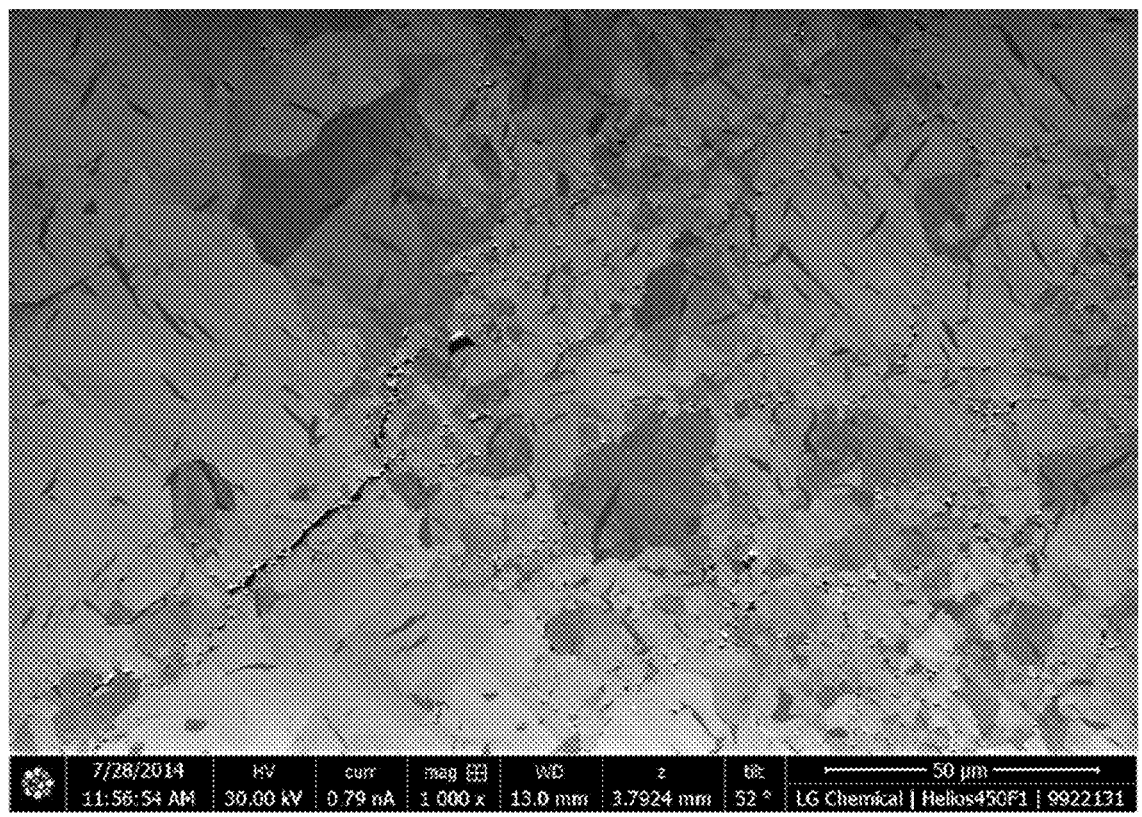
Figure 5:
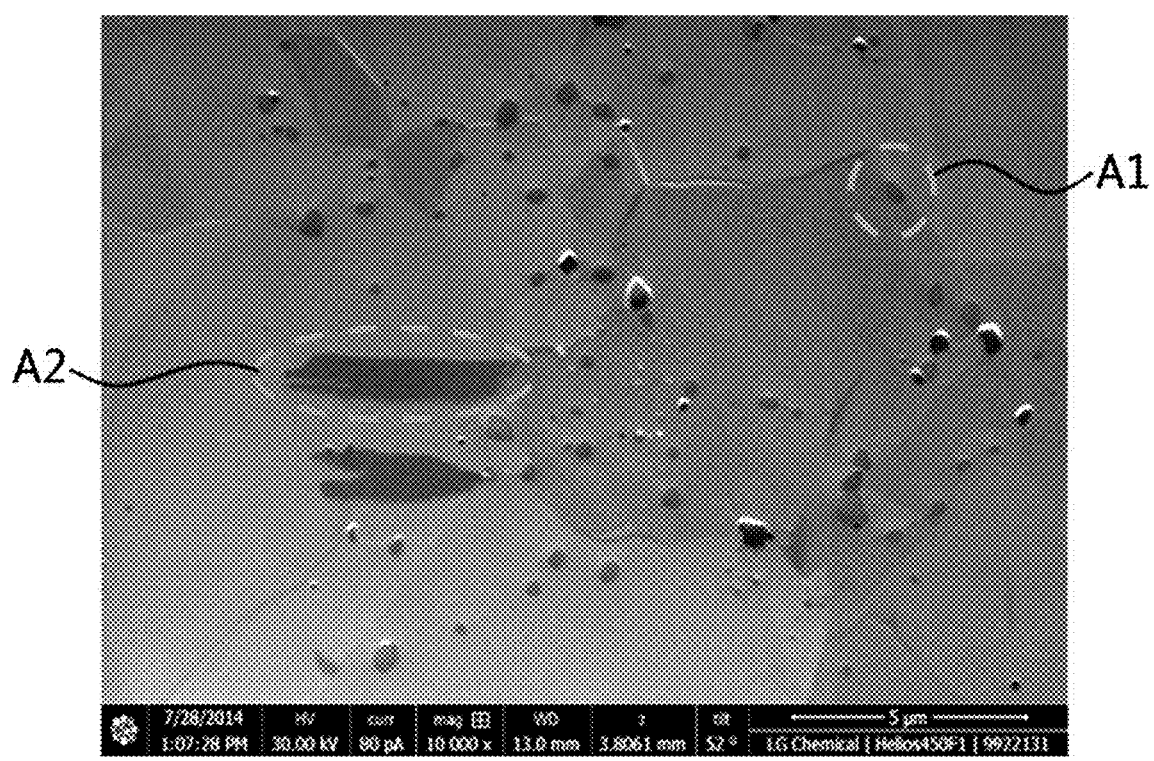

FIGS. 3 to 5 are scanning ion microscopy (SIM) photographs showing thermoelectric materials according to several embodiments of the present disclosure. In more detail, FIGS. 3 and 4 show SIM images of $Cu_2Ag_{0.025}Se$ and $Cu_2Ag_{0.075}Se$, respectively, and FIG. 5 shows an SIM image showing $Cu_2Ag_{0.025}Se$ with a higher magnification in comparison to FIG. 3. In addition, FIGS. 6 and 7 are graphs showing EDS analysis results for a portion A1 and a portion A2 of FIG. 5, respectively.

First, referring to FIGS. 3 to 5, in the thermoelectric material of the present disclosure, it may be found that there exist a plurality of grains having a size of several micrometers to several ten micrometers and a plurality of nano-dots having a nanometer size smaller than the grains, for example nanoparticles having a size of several ten nanometers to several hundred nanometer s. For example, the thermoelectric material of the present disclosure may include particles having a size of 10 nanometers to 500 nanometers. In addition, these nanoparticles may be Cu-containing nanoparticle.

Figure 6:
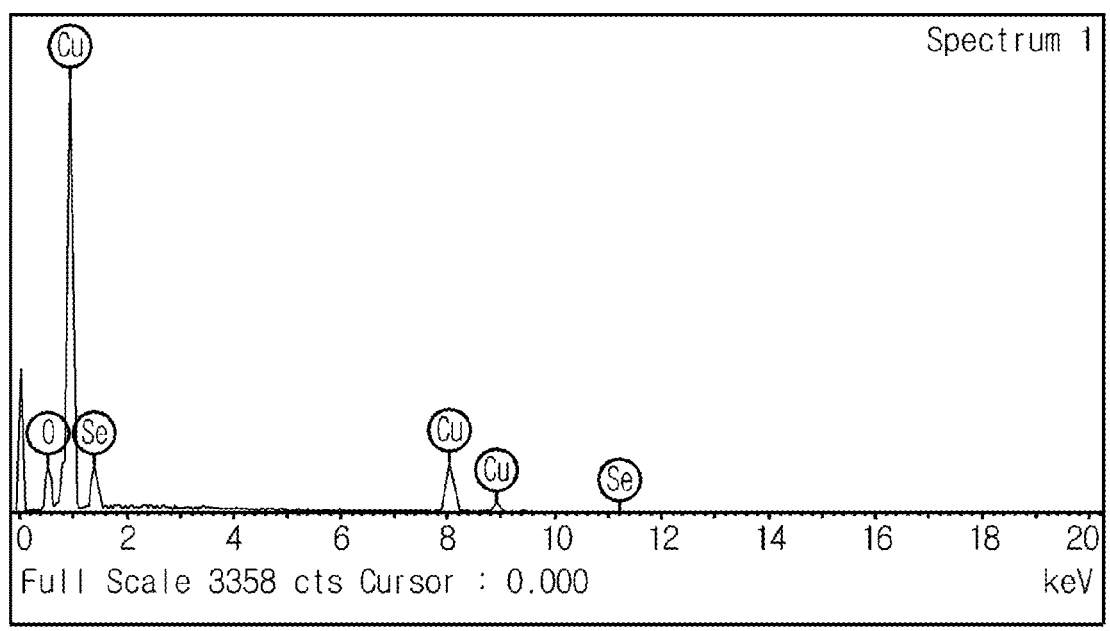
FIGS. 6 and 7 are graphs showing EDS analysis results for a portion A1 and a portion A2 of FIG. 5, respectively.
Figure 7:
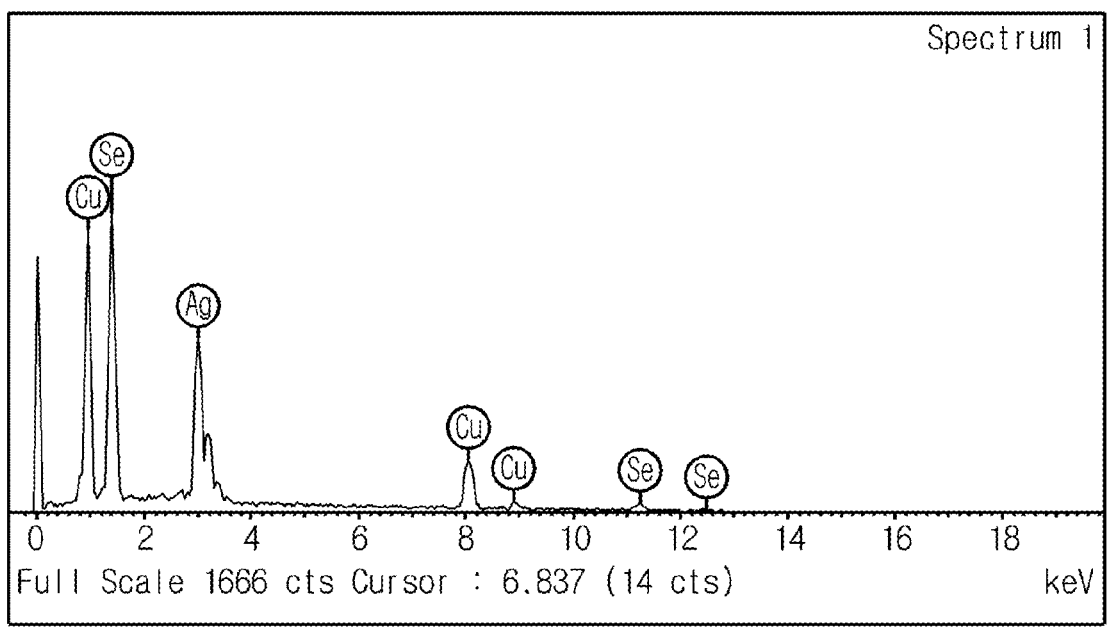

In other words, seeing the result of FIG. 6 in which a portion marked by A1 of FIG. 5 where a single nanoparticle is located, it may be found that a Cu peak is dominantly high. This may represent that the nanoparticle is not provided as a Cu—Se matrix or a Cu—Ag—Se matrix but provided as another Cu-containing component. Here, Se peak is observed a little, and this may represent that Se present in a Cu—Se matrix located near or below the nanoparticle due to the limit of resolution power of an analyzing machine or the limit of analysis method is measured.

Therefore, based on the above results, it may be understood that the particle shown in the portion A1 of FIG. 5 is a nanoparticle containing Cu as a main component. For this reason, the thermoelectric material according to an embodiment of the present disclosure may be regarded as a thermoelectric material including a Cu-containing nanoparticle in addition to the Cu—Se matrix composed of Cu and Se and a Cu—Ag—Se matrix composed of Cu, Ag and Se. Here, the Cu-containing nanoparticle may be provided to have Cu solely, but as shown in FIG. 6 where an O peak is observed a little, Cu may be bound to O to be present as a Cu oxide such as $Cu_2O$.

Meanwhile, if locations of nanoparticles in FIGS. 3 to 5 are taken into consideration, it may be found that a considerable number of nanoparticles are present along a grain boundary of the matrix. At this time, the matrix may be a Cu—Se matrix or a Cu—Ag—Se matrix, as described above. Therefore, in the present disclosure, it may be regarded that at least a part of the Cu-containing nanoparticles are present at a grain boundary of the Cu—Se matrix or the Cu—Ag—Se matrix. However, the locations of the Cu-containing nanoparticles are not limited to the grain boundary of the matrix, and a part of them may be present in a grain of the matrix.

In addition, referring to FIGS. 3 to 5, the thermoelectric material of the present disclosure may include other structures in addition to the plurality of grains or the Cu-containing nanoparticle. For example, seeing the portion marked by A2 in FIG. 5, it may be found that a structure having a size of several micrometers is present in a horizontally elongated line shape, different from grains or nanoparticles. In addition, from the results of FIG. 7 in which a location of such a microstructure is analyzed, it may be found that a Cu peak, a Se peak and an Ag peak are formed high.

Therefore, from the above results, the microstructure depicted in the portion A2 of FIG. 5 may be regarded as a microstructure containing Ag, Cu and Se as main components. In particular, as shown in the figure, the microstructure may have a size of about 1 micrometer to 30 micrometers. Further, such linear microstructures are formed more in FIG. 4, compared with FIG. 3. Therefore, it may be understood that such microstructures get more as the amount of added Ag is greater.

Therefore, the thermoelectric material according to an embodiment of the present disclosure may include a Cu-containing nanoparticle and/or an Ag-containing microstructure (for example, a CuAgSe microstructure) in addition to the Cu—Se matrix and/or Cu—Ag—Se matrix having a plurality of grains. In this aspect of the present disclosure, phonon scattering may be generated due to the Cu-containing nanoparticle and/or the Ag-containing microstructure. Therefore, in the present disclosure, thermal conductivity may be lowered, and thus thermoelectric conversion performance may be improved.

The thermoelectric material of the present disclosure may be fabricated according to the following method.

Figure 8:
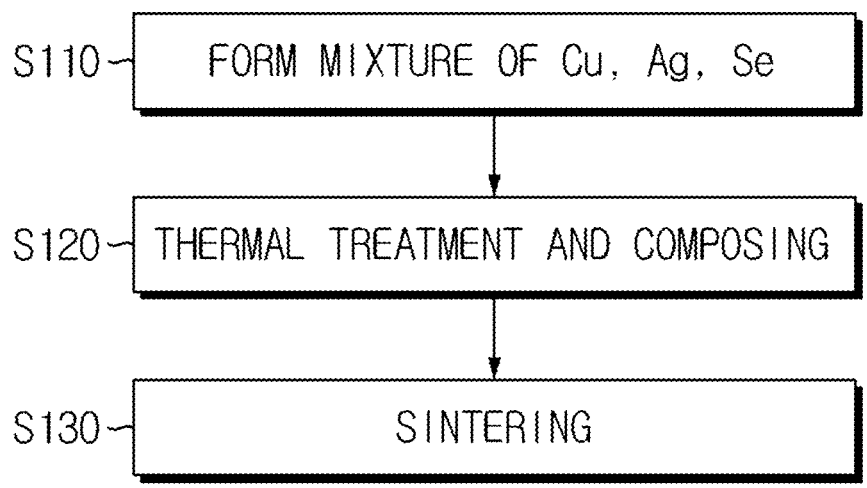
FIG. 8 is a flowchart for schematically illustrating a method for manufacturing a thermoelectric material according to an embodiment of the present disclosure.

FIG. 8 is a flowchart for schematically illustrating a method for manufacturing a thermoelectric material according to an embodiment of the present disclosure.

As shown in FIG. 8, the method for fabricating a thermoelectric material according to the present disclosure may include a mixture forming step S110 and a compound forming step S120.

In the mixture forming step S110, Cu, Ag and Se are mixed as raw materials to form a mixture. In particular, in the Step S110, Cu, Ag and Se may be weighed according to Chemical Formula 1, namely to conform to formula weights of $Cu_2Ag_xSe$ (0<x≤0.6), and then mixed to form a mixture.

Here, in the Step S110, Cu, Ag and Se in a powder form may be mixed. In this case, Cu, Ag and Se may be mixed more easily, which allows easier composing of $Cu_2Ag_xSe$.

Meanwhile, in the mixture forming step S110, Cu, Ag and Se may be mixed by means of hand milling using a mortar, ball milling, planetary ball mill, and the like, but the present disclosure is not limited to these specific mixing methods.

In the compound forming step S120, the mixture formed in the Step S110 is thermally treated to compose $Cu_2Ag_xSe$ (0<x≤0.6). For example, in the Step S120, the mixture of Cu, Ag and Se is put into a furnace and heated at predetermined temperature for a predetermined time so that $Cu_2Ag_xSe$ may be composed. Here, the Step S120 may be formed in a temperature range of 200° C. to 650° C. for 1 to 24 hours. For example, the Step S120 may be formed under a temperature condition of 500° C. for 15 hours.

In the step S120, in order to form $Cu_2Ag_xSe$, the mixture of Cu, Ag and Se may be put into a hard mold and formed into pellets, and the mixture in a pellet form may be put into a fused silica tube and vacuum-sealed. Also, the vacuum-sealed first mixture may be put into the furnace and thermally treated.

Preferably, as shown in FIG. 8, the method for manufacturing a thermoelectric material according to the present disclosure may further include sintering the compound under pressure S130 after the compound forming step S120 is performed.

Here, the step S130 may be performed by means of hot pressing (HP) or spark plasma sintering (SPS). The thermoelectric material according to the present disclosure may easily have a higher sintering density and a thermoelectric performance improvement effect, when sintered by means of pressure sintering.

For example, the pressure sintering step may be performed under the pressure condition of 30 MPa to 200 MPa. Also, the pressure sintering step may be performed under the temperature condition of 300° C. to 800° C. Also, the pressure sintering step may be performed under the pressure and temperature conditions for 1 minute to 12 hours.

Also, the step S130 may be performed in a vacuum state or in a state where gas such as Ar, He, $N_2$, and the like containing some or no hydrogen is flowing.

Also preferably, in the step S130, the compound formed in the step S120 may be ground into powder, and then pressure sintering may be performed. In this case, the sintering and measuring step may be more conveniently performed, and the sintering density may further increase.

Meanwhile, in the method for manufacturing a thermoelectric material, even though it has been illustrated that Ag is mixed together with Cu and Se and then thermally treated all together, the present disclosure is not limited thereto.

In particular, in a method for manufacturing a thermoelectric material according to another embodiment of the present disclosure, Cu and Se may be mixed and thermally treated to form $Cu_2Se$, and then Ag is added thereto. In this case, the method for manufacturing a thermoelectric material according to the present disclosure may include mixing Cu and Se to form a first mixture, thermally treating the first mixture to form a $Cu_2Se$ compound, mixing the $Cu_2Se$ compound with Ag to form a second mixture, and thermally treating the second mixture to form a compound expressed as Chemical Formula 1.

Hereinafter, the present disclosure will be described in detail through examples and comparative examples. The examples of the present disclosure, however, may take several other forms, and the scope of the present disclosure should not be construed as being limited to the following examples. The examples of the present disclosure are provided to more fully explain the present disclosure to those having ordinary knowledge in the art to which the present disclosure pertains.

Example 1

Cu, Ag and Se in a powder form were weight to conform to the chemical formula of $Cu_2Ag_{0.025}Se$, and then put into an alumina mortar, followed by mixing. The mixed materials were put into a hard mold, formed into pellets, put into a fused silica tube, and vacuum-sealed. In addition, the resultant product was put into a box furnace and heated at 500° C., and after heating, was slowly cooled down to room temperature to obtain a $Cu_2Ag_{0.025}Se$ compound.

In addition, the $Cu_2Ag_{0.025}Se$ compound was filled into a hard mold for hot pressing, and hot press sintering was performed thereto in the condition of 650° C. in a vacuum state to obtain a sample of Example 1. At this time, a sintering density was set to be 98% or above in comparison to a theoretical value.

Example 2

Cu, Ag and Se in a powder form were weight to conform to the chemical formula of $Cu_2Ag_{0.05}Se$, and then mixed and composed in the same way as Example 1 to obtain a $Cu_2Ag_{0.05}Se$ compound. In addition, the compound was sintered in the same way as Example 1 to obtain a sample of Example 2.

Example 3

Cu, Ag and Se in a powder form were weight to conform to the chemical formula of $Cu_2Ag_{0.075}Se$, and then mixed and composed in the same way as Example 1 to obtain a $Cu_2Ag_{0.075}Se$ compound. In addition, the compound was sintered in the same way as Example 1 to obtain a sample of Example 3.

Example 4

Cu, Ag and Se in a powder form were weight to conform to the chemical formula of $Cu_2Ag_{0.1}Se$, and then mixed and composed in the same way as Example 1 to obtain a $Cu_2Ag_{0.1}Se$ compound. In addition, the compound was sintered in the same way as Example 1 to obtain a sample of Example 4.

Comparative Example

Cu and Se in a powder form were weight to conform to the chemical formula of $Cu_2Se$, and then mixed and composed in the same way as Example 1 to obtain a $Cu_2Se$ compound. In addition, the compound was sintered in the same way as Example 1 to obtain a sample of the Comparative Example.

As described above with reference to FIGS. 1 to 7, it was found that the samples of Examples 1 to 4 include a Cu-containing nano-dot and an Ag-containing microstructure in addition to the Cu—Se matrix and/or the Cu—Ag—Se matrix. Meanwhile, it was found that the sample of the Comparative Example does not include a Cu-containing nano-dot and an Ag-containing microstructure.

Figure 9:
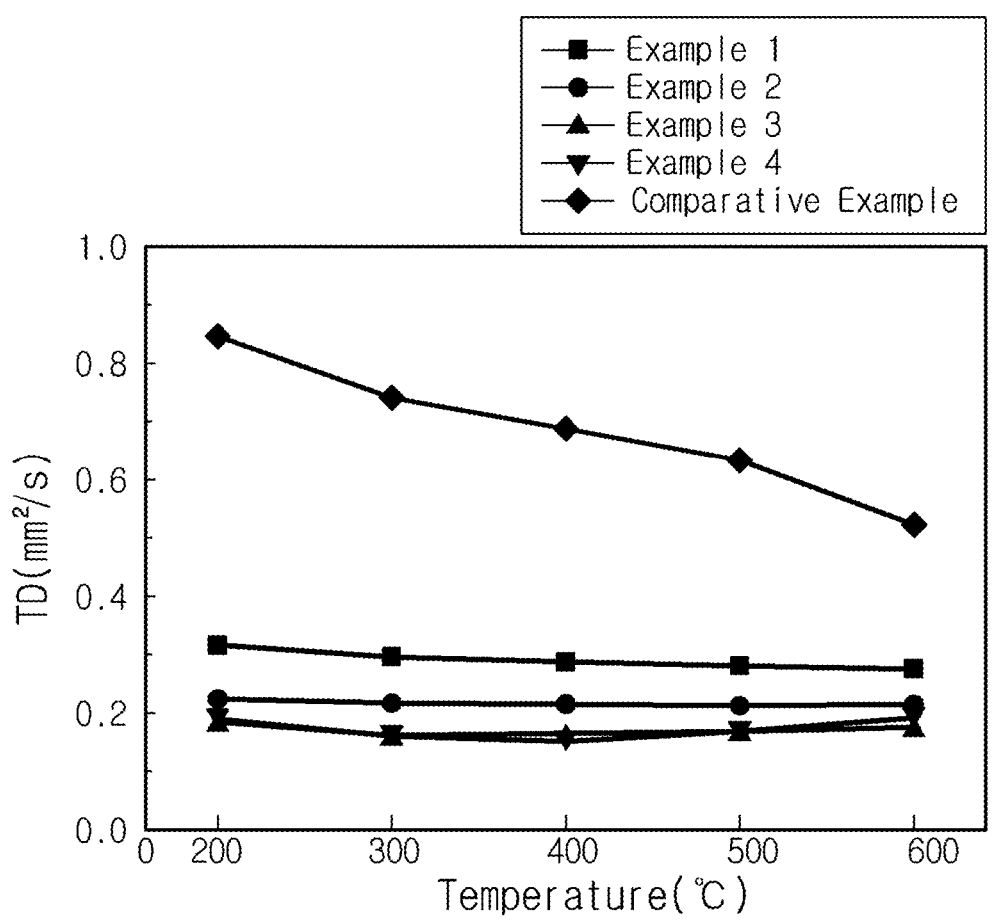
FIG. 9 is a graph comparatively showing thermal diffusivity measurement results according to temperature of thermoelectric materials prepared according to examples of the present disclosure and a comparative example.

For the samples of Examples 1 to 4 and the sample of the Comparative Example, thermal diffusivity (TD) was measured at predetermined temperature intervals by using LFA457 (Netzsch). The measurement results are depicted in FIG. 9 as Examples 1 to 4 and the Comparative Example.

In addition, for the samples of Examples 1 to 4 and the sample of the Comparative Example, electrical conductivity and Seebeck coefficient were measured at predetermined temperature intervals by using ZEM-3 (Ulvac-Riko, Inc.). Among them, the measurement results of Seebeck coefficient (S) are depicted in FIG. 10 as Examples 1 to 4 and the Comparative Example.

In addition, ZT values were calculated by using the measured values. The calculation results are depicted in FIG. 11 as Examples 1 to 4 and the Comparative Example.

First, referring to the results of FIG. 9, the thermoelectric materials of Examples 1 to 4 expressed as $Cu_2Ag_xSe$ (x=0.025, 0.05, 0.075, 0.1) have thermal diffusivity of about 0.4 mm²/s or below through the overall temperature range of 200° C. to 600° C. In addition, it may be understood that the thermal diffusivity of the examples is greatly lower than the thermal diffusivity of the Comparative Example expressed as $Cu_2Se$ through the overall temperature range. In particular, in the thermoelectric material of the Comparative Example, the thermal diffusivity greatly increases when temperature drops from 600° C. to 200° C., but in the thermoelectric materials of Examples 1 to 4, the thermal diffusivity does not change seriously when temperature drops from 600° C. to 200° C. Further, in a temperature region of 200° C. to 600° C., it may be found that the thermal diffusivity of Examples 2 to 4, particularly Example 3 and 4, is greatly low.

Figure 10:
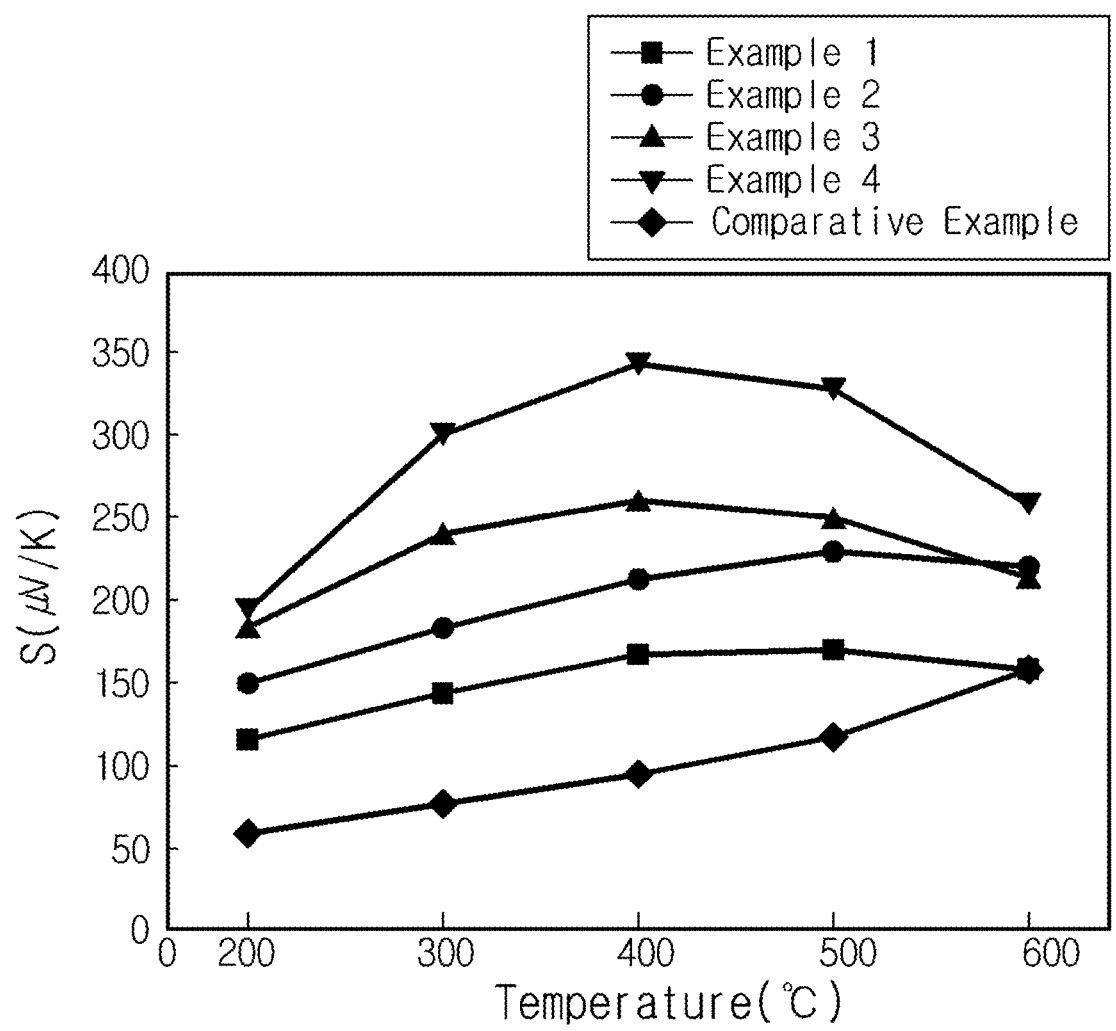
FIG. 10 is a graph comparatively showing Seebeck coefficient measurement results according to temperature of thermoelectric materials prepared according to examples of the present disclosure and a comparative example.

Next, referring to the results of FIG. 10, it may be understood that the thermoelectric materials of Examples 1 to 4 according to the present disclosure have greatly high Seebeck coefficients through the overall temperature range of 200° C. to 600° C., compared with the thermoelectric material of the Comparative Example. Further, it may be understood that the Seebeck coefficients of Examples 2 to 4, particularly Example 3 and 4, are greatly higher than that of the Comparative Example.

Figure 11:
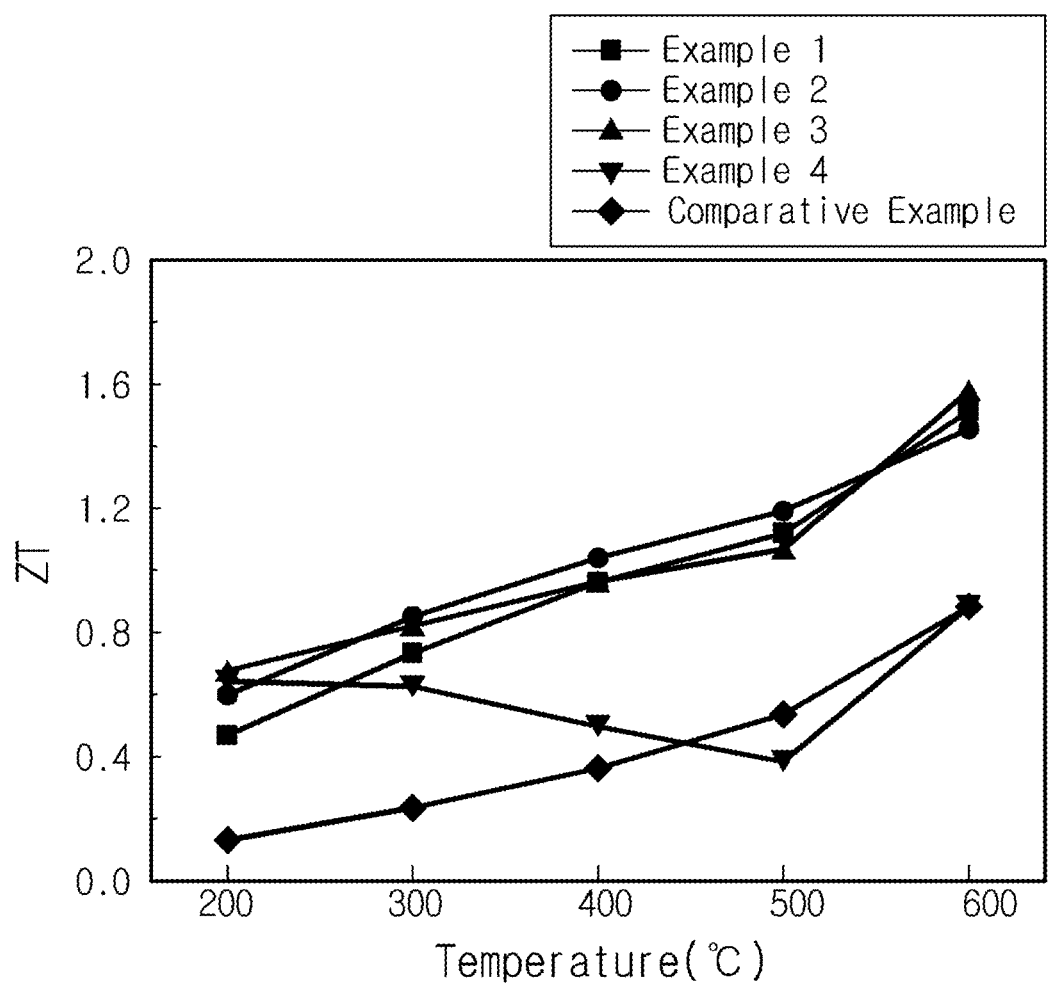
FIG. 11 is a graph comparatively showing ZT value measurement results according to temperature of thermoelectric materials prepared according to examples of the present disclosure and a comparative example.

In addition, if a ZT value of each sample is taken into consideration with reference to the results of FIG. 11, it may be understood that the thermoelectric materials of Examples 1 to 4 according to the present disclosure have greatly high ZT values, compared with the thermoelectric material of the Comparative Example.

In particular, it is observed that the thermoelectric materials of Examples 1 to 3 have very high ZT values in the overall temperature range of 200° C. to 600° C., compared with the thermoelectric material of the Comparative Example. Further, the thermoelectric materials of Examples 2 and 3, particularly Example 3, are greatly different from the thermoelectric material of the Comparative Example in the overall temperature range.

In more detail, referring to the results of FIG. 11, in a temperature condition of 200° C., it is found that the Comparative Example has a ZT value lower than 0.2, but Examples 1 to 4 have ZT values equal to or greater than 0.4, substantially equal to or greater than 0.6 (Examples 2 to 4).

In addition, in a temperature condition of 300° C., the Comparative Example has a ZT value near 0.2, but Examples 1 to 4 have ZT values equal to or greater than 0.6, substantially equal to or greater than 0.8 (Examples 2 and 3).

In addition, in a temperature condition of 400° C., the Comparative Example has a ZT value lower than 0.4, but Examples 1 to 3 have ZT values equal to or greater than 0.8, substantially equal to or greater than 1.0 (Example 2).

In addition, in a temperature condition of 500° C., the Comparative Example has a ZT value lower than 0.6, but Examples 1 to 3 have ZT values equal to or greater than 1.0.

In addition, in a temperature condition of 600° C., the Comparative Example has a ZT value lower than 1.0, but Examples 1 to 3 have ZT values equal to or greater than 1.4 which is very high.

From the above, it may be understood that the thermoelectric material according to each embodiment of the present disclosure has greatly lower thermal diffusivity, a higher Seebeck coefficient and a greatly improved ZT value through the entire temperature range of 200° C. to 600° C., compared with the compound semiconductor of the Comparative Example. Therefore, the thermoelectric material of the present disclosure may be regarded as having excellent thermoelectric conversion performance.

A thermoelectric conversion element according to the present disclosure may include the above thermoelectric material. Particularly, the thermoelectric material according to the present disclosure may greatly lower thermal diffusivity or conductivity and effectively improve a Seebeck coefficient and a ZT value in a broad temperature range, in comparison to traditional thermoelectric materials, particularly $Cu_2Se$ thermoelectric materials. Thus, the thermoelectric material according to the present disclosure may be used instead of traditional thermoelectric conversion materials or usefully applied to a thermoelectric conversion element in conjunction with traditional thermoelectric conversion materials.

Further, the thermoelectric material according to the present disclosure may be used in a thermoelectric power generator designed for thermoelectric power generation using a waste heat source or the like. That is, the thermoelectric power generator according to the present disclosure includes the above thermoelectric material described above. The thermoelectric material according to the present disclosure exhibits a high ZT value in a broad temperature range, for example in a temperature range of 200° C. to 600° C., and thus may be more useful for thermoelectric power generation.

Also, the thermoelectric material according to the present disclosure may be manufactured as a bulk-type thermoelectric material.

The present disclosure has been described in detail. However, it should be understood that the detailed description and specific examples, while indicating preferred embodiments of the disclosure, are given by way of illustration only, since various changes and modifications within the spirit and scope of the disclosure will become apparent to those skilled in the art from this detailed description.

What is claimed is:

1. A thermoelectric material expressed by Chemical Formula 1 below, the material comprising:
   a matrix having Cu and Se;
   a Cu-containing particle; and
   an Ag-containing particle, $Cu_2Ag_xSe$                   <Chemical Formula 1> where $0 < x \leq 0.6$.

2. The thermoelectric material according to claim 1, wherein the Cu-containing particle is a nanoparticle.

3. The thermoelectric material according to claim 1, wherein the Ag-containing particle is a grain having a micrometer size.

4. The thermoelectric material according to claim 1, wherein the matrix includes a plurality of grains composed of Cu and Se and a plurality of grains composed of Cu, Ag and Se.

5. The thermoelectric material according to claim 4, wherein the Cu-containing particle is located at a grain boundary of the matrix.

6. The thermoelectric material according to claim 1, wherein in Chemical Formula 1, x satisfies a condition of $0.025 \leq x$.

7. The thermoelectric material according to claim 1, wherein in Chemical Formula 1, x satisfies a condition of $x \leq 0.2$.

8. A method for manufacturing a thermoelectric material, comprising:
   forming a mixture by weighing and mixing Cu, Ag and Se according to Chemical Formula 1 below; and
   thermally treating the mixture under a temperature condition of 200° C. to 650° C. for 1 to 24 hours to synthesize a compound expressed by Chemical Formula 1 below:

$Cu_2Ag_xSe$                   <Chemical Formula 1> where $0 < x \leq 0.6$.

9. The method for manufacturing a thermoelectric material according to claim 8, further comprising:
   sintering the compound under pressure under a pressure condition of 30 MPa to 200 MPa and a temperature condition of 300 to 800° C. after the compound forming step is performed.

10. The method for manufacturing a thermoelectric material according to claim 9, wherein the sintering step is performed by hot pressing or spark plasma sintering.

11. The method for manufacturing a thermoelectric material according to claim 9, wherein the compound is ground into powder before it is sintered.

12. The method for manufacturing a thermoelectric material according to claim 8, wherein in the mixture forming step, Cu, Ag and Se in a powder form are mixed.

13. A thermoelectric conversion element, comprising a thermoelectric material defined in claim 1.

14. A thermoelectric power generator, comprising a thermoelectric material according to claim 1.

15. The thermoelectric material of claim 1, wherein the Cu-containing particle is a first grain and the Ag-containing particle is a second grain, and the thermoelectric material includes a plurality of the first and second grains.

* * * * *